United States Patent [19]
Phillips

[11] Patent Number: 4,540,278
[45] Date of Patent: Sep. 10, 1985

[54] OPTICAL FOCUSING SYSTEM

[75] Inventor: Edward H. Phillips, Middletown, Calif.

[73] Assignee: Optimetrix Corporation, Mountain View, Calif.

[21] Appl. No.: 638,709

[22] Filed: Aug. 8, 1984

Related U.S. Application Data

[60] Continuation of Ser. No. 491,722, May 5, 1983, abandoned, which is a division of Ser. No. 183,402, Sep. 2, 1980, Pat. No. 4,383,757, which is a continuation of Ser. No. 25,917, Apr. 2, 1979, abandoned.

[51] Int. Cl.$^3$ .............................................. G03B 27/52
[52] U.S. Cl. ........................................ 355/55; 355/45
[58] Field of Search ................................. 355/45, 55

[56] References Cited

U.S. PATENT DOCUMENTS

| | | | |
|---|---|---|---|
| 3,041,459 | 6/1962 | Greene, Jr. | 250/201 |
| 3,532,045 | 10/1970 | Genähr | 95/45 |
| 3,541,338 | 11/1970 | Duda et al. | 250/219 |
| 3,685,117 | 8/1972 | Wing et al. | 29/203 P |
| 3,722,996 | 3/1973 | Fox | 355/53 |
| 3,735,686 | 5/1973 | Brewer et al. | 95/44 R |
| 3,796,497 | 3/1974 | Mathisen et al. | 356/152 |
| 3,864,033 | 2/1975 | Rieder | 353/101 |
| 3,865,483 | 2/1975 | Wojcik | 355/43 |
| 4,070,116 | 1/1978 | Frosch et al. | 356/156 |
| 4,128,847 | 12/1978 | Roullet et al. | 358/128 |
| 4,238,157 | 12/1980 | Strauch et al. | 356/3 |

FOREIGN PATENT DOCUMENTS

| | | |
|---|---|---|
| 1032382 | 6/1978 | Canada .................. 28/94.5 |
| 2417058 | 9/1975 | Fed. Rep. of Germany . |
| 2274073 | 1/1976 | France . |
| 2330030 | 5/1977 | France . |
| 1501908 | 2/1978 | United Kingdom . |

OTHER PUBLICATIONS

Applied Optics and Engineering, vol. IV, pp. 36-39, (1967).
Fujitsu Scientific & Technical Journal, vol. 15, No. 4, Dec. 1979, pp. 77-94, (T. Uchiyama et al.: "A Precision Auto Mask Aligner").
Bell Systems Technical Journal, vol. 49, No. 9, Nov. 1970, pp. 2145-2177, (D. S. Alles et al.: "The Step-and-Repeat Camera").

Primary Examiner—Monroe H. Hayes
Attorney, Agent, or Firm—Roland I. Griffin

[57] ABSTRACT

An optical focusing system is provided for accurately focusing a wafer surface, thereby enabling the production of sharp microcircuit images. Accurate focusing is achieved despite non-parallel and non-flat wafer surfaces, despite differences in reflectivity of different portions of the wafer surface, and despite changes in environmental conditions such as temperature during system operation.

The system comprises a full aperture focus detection apparatus, a kinematic lens positioning apparatus, and a kinematic wafer chuck differential leveling or positioning apparatus. The full aperture focus detection apparatus detects the extent to which a wafer surface is out of focus with respect to the image plane of a projection lens, and produces an amplified differential signal having magnitude and polarity indicative of the extent and direction, relative to the image plane, that the wafer surface is out of focus. When the center of the wafer surface is to be focused and is positioned along the optical axis of the system, the amplified differential signal causes the kinematic lens positioning apparatus to focus the center of the wafer surface by moving the projection lens a distance and direction corresponding to the magnitude and polarity of the amplified differential signal.

The kinematic wafer chuck differential leveling or positioning apparatus provides for differentially leveling the chuck at three selected off-center locations. When a point on the wafer surface corresponding to one of these three locations is to be focused and is positioned along the optical axis of the system, the amplified differential signal causes the kinematic wafer chuck differential leveling or positioning apparatus to focus that point by raising or lowering the chuck at exactly that point.

16 Claims, 25 Drawing Figures

LIGHT FROM IMAGING LIGHT SOURCE (OFF DURING FOCUSSING)

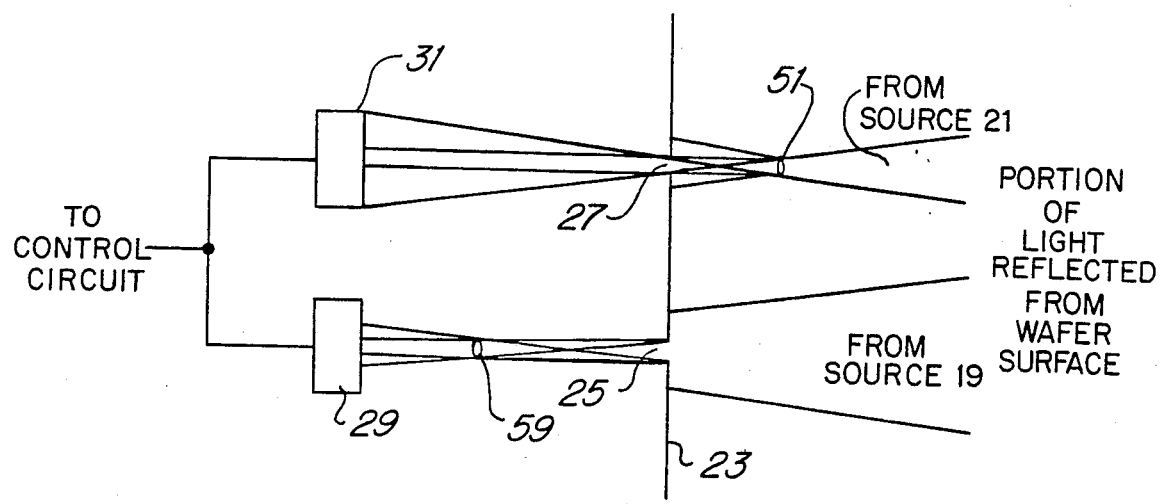
Figure 4
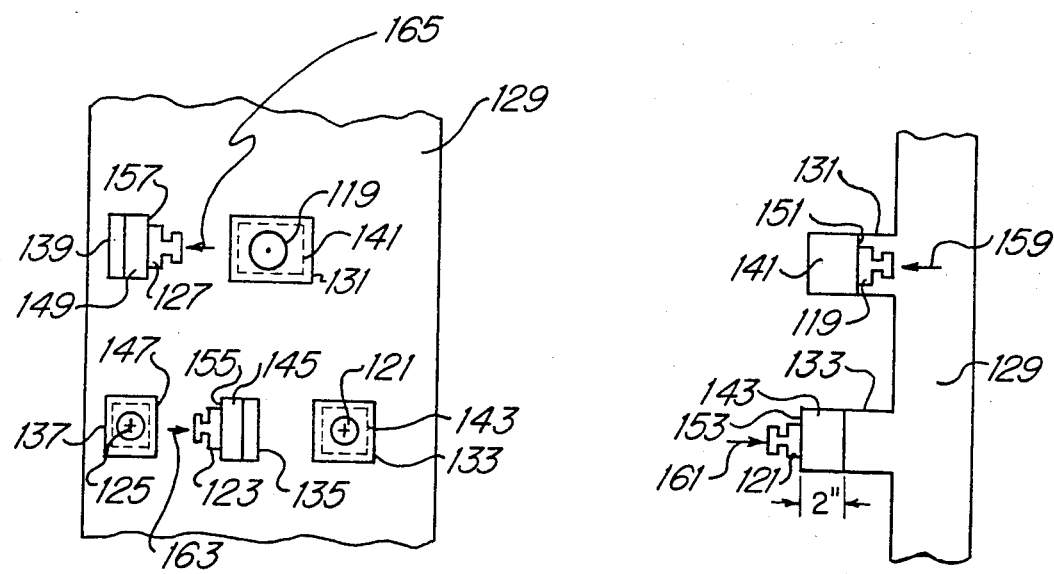
Figure 10A
Figure 10B

FRONT
TOP VIEW

FRONT
BOTTOM VIEW

OPTICAL FOCUSING SYSTEM

CROSS REFERENCE TO RELATED APPLICATIONS

This is a continuation of U.S. patent application Ser. No. 491,722 filed on May 5, 1983 (and now abandoned), which is a divisional of U.S. patent application Ser. No. 183,402 filed Sept. 2, 1980 (and issued as U.S. Pat. No. 4,383,757 on May 17, 1983), which is in turn a continuation of U.S. patent application Ser. No. 25,917 filed Apr. 2, 1979 (and now abandoned).

The invention described herein is related to and incorporates by reference the gas bearing system described in detail in companion U.S. patent application Ser. No. 023,616 entitled IMPROVED GAS BEARING, filed on Mar. 26, 1979, by Edward H. Phillips, assigned to the same assignee as the present application, and now abandoned.

BACKGROUND AND SUMMARY OF THE INVENTION

This invention relates generally to optical focusing systems of the type utilizing a reduction lens system for photometrically printing an image of a first object such as a reticle upon a second object such as a semiconductive wafer and, more specifically, to apparatus utilized in such systems to achieve precise focusing or positioning of the top surface of the wafer at the image plane of a projection lens of the lens system.

In the semiconductor industry, reduction lens systems are employed in the fabrication of photomasks to print an array of microcircuitry on each photomask. A set of such photomasks, each bearing an array of microcircuitry of a different level, is typically employed in the fabrication of integrated circuits from a semiconductive wafer. In the course of this fabrication, the semiconductive wafer is sequentially aligned with each photomask, and an exposure is made at each processing level to print the array of microcircuitry on the photomask onto the semiconductive wafer. Alternatively, similar reduction lens systems may be directly employed in an exposure operation to initially print each level of microcircuitry directly upon the semiconductive wafer rather than a photomask, thereby eliminating the photomask printing step entirely. However, whether a reduction lens system is employed to print a level of microcircuitry initially on a photomask or directly on a semiconductive wafer, the top surface of either the photomask or the wafer must be precisely focused, automatically, at the image plane of a projection lens of the lens system. In practice, however, precise focusing of semiconductive wafers is very difficult to achieve because of surface irregularities present in the surface of the unprocessed (unexposed) wafer or introduced as a result of various processing steps, resulting in mottled exposure of photoresist and unresolved microcircuit images formed upon the wafer.

Known prior-art systems do not adequately provide for detection of focus error due, for example, to imprecise focusing of the image plane of the projection lens at the edges of the exposure (i.e., at the edges of the portion of the wafer being exposed, which edges are sometimes not in the same horizontal plane as the center of the wafer). One such prior-art system is described, for example, in U.S. Pat. No. 3,722,996 entitled OPTICAL PATTERN GENERATOR OR REPEATING PROJECTOR OR THE LIKE and issued Mar. 27, 1973, to Wayne L. Fox. Other prior-art systems also do not adequately provide for detection of focus error because they often utilize sample areas which are too small (e.g., extremely small sample areas of about ten microns in diameter are generally used). One such prior-art system is described, for example, in U.S. Pat. No. 4,128,847 entitled OPTICAL READING DEVICE COMPRISING A FOCUSING DETECTION DEVICE and issued Dec. 5, 1978, to Gerald Roullet and Jean-Pierre Bortuzzo.

What would be useful in providing improved microcircuit exposures, therefore, is a system that would be capable of detecting when a selected portion of a wafer, even a portion close to an edge of the wafer, is out of focus due to variations in thickness or flatness of the wafer or other factors, and capable of correcting the detected out-of-focus condition by bringing the selected portion into focus prior to exposure. Also, to increase the utility of such a system, and, hence, the production of microcircuits, it would be desirable that the system be ruggedly constructed and not affected by small variations in environmental factors, such as temperature, as are many prior-art systems.

Accordingly, it is the principal object of this invention to provide an optical focusing system capable of accurately focusing wafer surfaces despite non-parallel, and otherwise non-flat conditions of a wafer surface.

Another object of this invention is to provide an optical focusing system incorporating a full aperture focus detection apparatus capable of accurately detecting the focus condition of a wafer surface despite non-parallel and otherwise non-flat conditions of the wafer surface.

Another object of this invention is to provide an optical focusing system incorporating a full aperture focus detection apparatus capable of accurately detecting the focus condition of a wafer surface utilizing the existing projection lens included in the associated exposure system.

Another object of this invention is to provide an optical focusing system incorporating a full aperture focus detection apparatus capable of accurately detecting the focus condition of a wafer surface while the associated exposure system is operational.

Another object of this invention is to provide an optical focusing system incorporating a full aperture focus detection apparatus capable of accurately detecting the focus condition of a wafer surface despite differences in reflectivity of different portions of the wafer surface.

Another object of this invention is to provide an optical focusing system incorporating a lens positioning apparatus that may be ruggedly handled without damage to the system.

Another object of this invention is to provide an optical focusing system incorporating a kinematic lens positioning apparatus capable of restraining five degrees of freedom of movement and permitting precise, unrestrained movement in the sixth degree of freedom of movement.

Another object of this invention is to provide an optical focusing system incorporating a kinematic lens positioning apparatus permitting the system to be virtually perturbation free in the directions in which the system is constrained.

Another object of this invention is to provide an optical focusing system incorporating a kinematic wafer chuck differential leveling or positioning apparatus capable of leveling the chuck to compensate for non-parallel conditions of a wafer.

Still another object of this invention is to provide a kinematic system for positioning a lens along a single axis and a kinematic system for positioning a wafer chuck parallel to a selected plane.

These and other objects, which will become apparent from a reading of this specification and a review of the accompanying drawings, are accomplished according to the illustrated preferred embodiment of the present invention by providing an optical focusing system comprising a full aperture focus detection apparatus, a kinematic lens positioning apparatus, and a kinematic wafer chuck differential leveling or positioning apparatus. The full aperture focus detection apparatus detects the focus condition of a wafer relative to the image plane of a projection lens associated with the kinematic lens positioning apparatus, and actuates the kinematic lens positioning apparatus and/or the kinematic wafer chuck differential leveling or positioning apparatus to correct for an out-of-focus condition of the wafer and to accurately focus the surface of the wafer. In response to this actuation, the kinematic lens positioning apparatus makes coincident the image plane and the top surface of the wafer, and the kinematic wafer chuck differential leveling or positioning apparatus corrects for a non-parallel condition of the wafer surface by bringing discrete surface regions of interest into a common plane, namely the image plane of the projection lens.

The kinematic lens positioning apparatus includes a slide for supporting the projection lens, a drive mechanism for moving the slide, and constraining apparatus (including the drive mechanism) for kinematically constraining the slide and, hence, the projection lens to move along a single axis. The kinematic wafer chuck differential leveling or positioning apparatus includes first, second and third spaced drive mechanisms for supporting the wafer chuck for translational movement along a first axis parallel to the single axis of movement of the projection lens and for rotational movement about second and third axes orthogonal to the first axis. It also includes constraining apparatus (including the first, second and third drive mechanisms) for kinematically constraining the wafer chuck to move only along the first axis and about the second and third axes.

BRIEF DESCRIPTION OF THE DRAWINGS

FIG. 4 is a block diagram of a pair of matched detectors included in the apparatus of FIG. 2A, and a graphic illustration of reflected light incident upon the detectors.

FIGS. 10A and 10B are front and right side views, respectively, illustrating the action of air bearings included in the apparatus of FIG. 9.

DESCRIPTION OF THE PREFERRED EMBODIMENT

Figure 1:
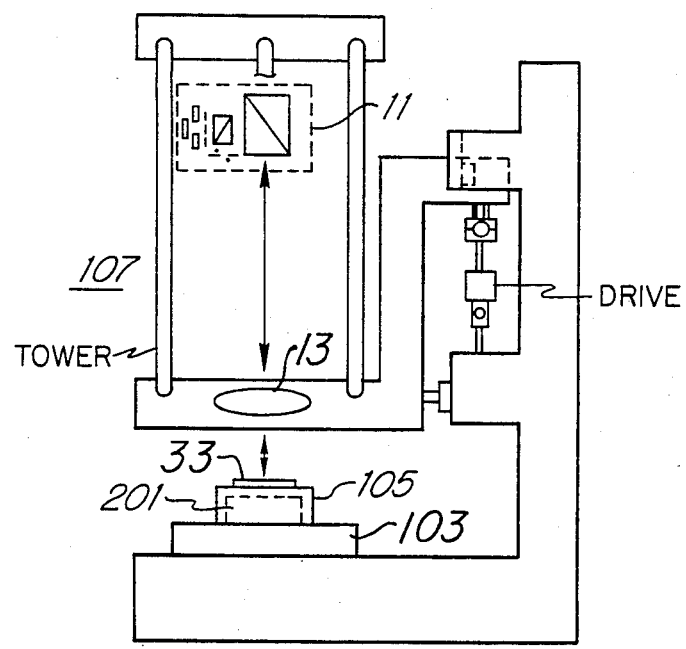
FIG. 1 is a right side view of an optical focusing system in accordance with the preferred embodiment of the present invention.

Referring now to FIG. 1 of the drawings, there is shown an optical focusing system comprising a full aperture focus detection apparatus (or focus detector) 11, a kinematic lens positioning apparatus 107 having a tower portion and a drive portion, and a kinematic wafer chuck differential leveling or positioning apparatus 201. FIG. 2A shows focus detector 11 in greater detail. Focus detector 11 operates in conjunction with a 10:1 projection lens 13 associated with kinematic lens positioning apparatus 107 (described hereinafter) and comprises a first beam splitter 15, a second beam splitter 17, at least two focusing light sources 19, 21, an opaque aperture plate 23 (with at least two selected small apertures 25, 27), at least two matched differential diode detectors 29, 31 (e.g., detectors such as the two active areas of bi-cell detector Model No. PIN SPOT/2D commercially available from United Detector Technology Corporation of Santa Monica, Calif., and a control circuit 71. Focusing light sources 19, 21 may be, for example, fiber optic light sources capable of receiving and transmitting light from a light source such as a mercury lamp 18. The diameters of light sources 19, 21 are, for example, 100 microns, with the light from mercury lamp 18 passing through a filter 24 to eliminate light of such wavelengths as would cause premature, unwanted exposure of a wafer 33. Focusing light sources 19, 21 are each disposed a selected short equal distance $d_1$, $d_2$ (e.g., $d_1 = d_2 = 0.109$ inches), in front of and behind an imaginary re-image plane 37 where the re-image plane 37 and an object plane 39 (lower surface of a reticle 35) are optically equidistant (e.g., 4.25 inches along respective light paths 41–42, 43) from the center of beam splitter 15. Likewise, aperture plate 23 is positioned at an alternate re-image plane 26. Alternate re-image plane 26 and re-image plane 37 are optically equidistant (e.g., 1.50 inches) from the center of beam splitter 17. Beam splitter 15 is an 80-20 beam splitter, passing 80 percent of the light directed along path 43 from the object or reticle plane 39 and reflecting 20 percent of the incident light from path 42. Beam splitter 17 is a 50-50 beam splitter, reflecting 50 percent of the light directed along path 41 from light sources 19, 21 and passing 50 percent of the light returning along path 42 from beam splitter 15.

To ensure faithful reproduction (imaging) upon wafer 33 of a microstructure or object contained on reticle 35 when light from an imaging or primary light source is incident upon reticle 35 (which light is turned off or shuttered-out during focusing), the top or upper surface of wafer 33 must be brought into focus at the image plane of projection lens 13 (i.e., the plane at which light from projection lens 13 comes into sharp focus, within the depth of focus of the projection lens, which depth of focus is for example ±1 micron). To bring the wafer 33 into focus, the extent to which and direction in which it may be out of focus must first be determined or detected (i.e., a signal indicative of the extent to which and the direction in which the wafer is out of focus must first be generated). This detection (signal generation) is accomplished by focus detector 11 (utilizing light from focusing light sources 19, 21), with light (along light path 43) from the imaging light source having been turned off or shuttered-out.

Figure 2E:
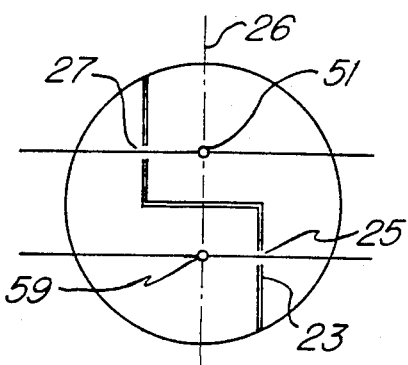
FIGS. 2B, 2C, 2D and 2E are block and schematic diagrams showing selected optical and circuit elements included in the apparatus of FIG. 2A.
Figure 2B:
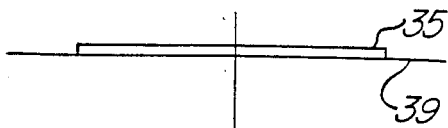
Figure 2B:
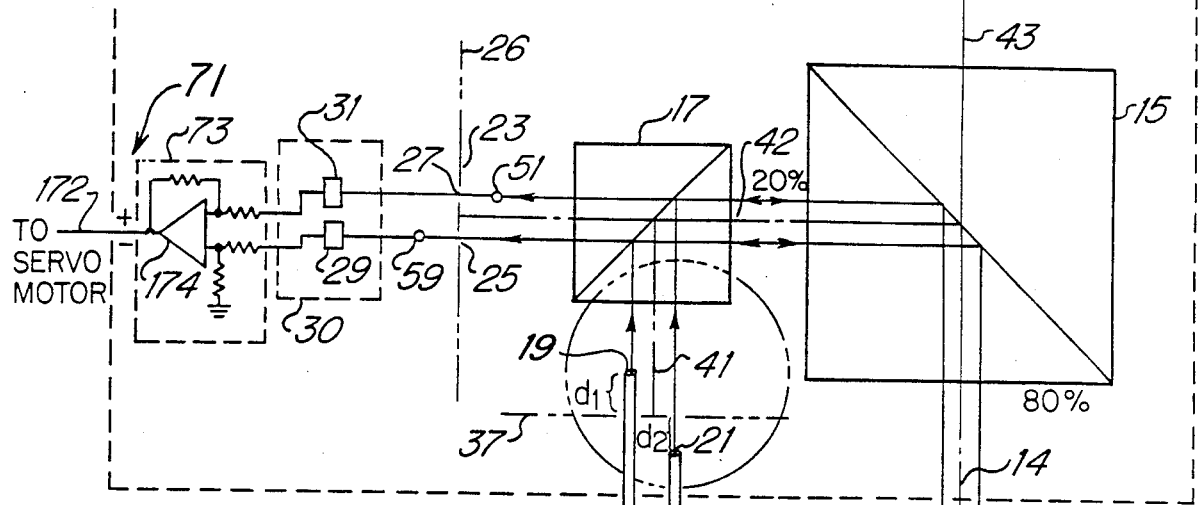
Figure 2B:
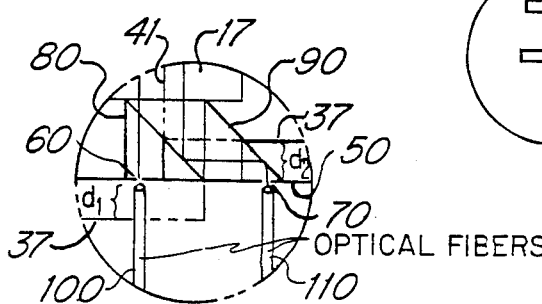
Figure 2A:
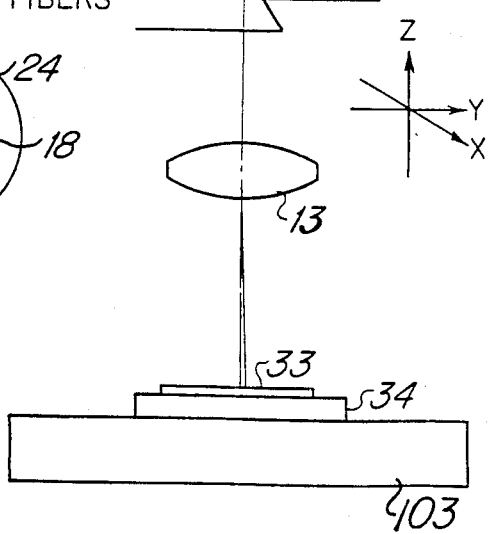
FIG. 2A is a combined block and schematic diagram showing a full aperture focus detection apparatus included in the system of FIG. 1.
Figure 3:
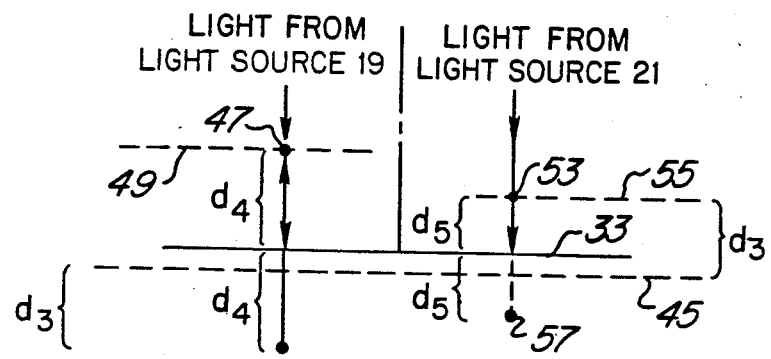
FIG. 3 is a graphic illustration of reflection of light from a wafer, the focus condition of which is detected by the apparatus of FIG. 2A.

As shown in FIGS. 2A and 3, a portion of the light directed from focusing light source 19, via beam splitters 17 and 15 (which light would be focused, in the absence of wafer 33, at a distance $d_3$ behind the image plane 45 of projection lens 13), is reflected from wafer 33 to form a real image 47 at an imaginary plane 49. A portion of the light corresponding to this real image is then reflected back via projection lens 13 and beam splitters 15 and 17 to form another real image 59 upon passage through aperture 25 of aperture plate 23, the diameters of apertures 25 and 27 being (for example, 100 microns) sufficiently sized to let a selected small amount of light through. On the other hand, light from focusing light source 21, traveling via beam splitters 17 and 15, becomes focused and forms a real image 53 at an imaginary plane 55 located at the distance $d_3$ above the image plane 45 of projection lens 13. The light forming real image 53 thus has to travel an additional distance $d_5$ in order to be reflected from the surface of wafer 33. A portion of the light corresponding to the real image 53 (or virtual image 57) is then reflected back, via projection lens 13 and beam splitters 15 and 17, to form anther real image 51 before aperture 27 of aperture plate 23.

Thus, as shown in FIG. 4, if after being reflected from wafer 33, light from light sources 19, 21 becomes refocused (re-imaged) at significantly different distances from aperture plate 23 due to the out-of-focus position of wafer 33, unequal amounts of light will pass through apertures 25 and 27 and be detected by differential diode detectors 29, 31. Upon detecting this difference in the amount or intensity of light, detectors 29, 31 generate current signals, the difference of which is proportional to this difference in the amount or intensity of light and, hence, to the extent to which wafer 33 is distant or "out-of-focus" from the image plane 45 of projection lens 13. Thus, it may be seen that light of equal intensity goes through apertures 25, 27 only if the images (i.e., the images of light sources 19, 21 as reflected from wafer 33) become focused symmetrically on opposite sides of aperture plate 23. If these images are not equidistant but are displaced an unequal distance from aperture plate 23 (i.e., displaced by an error in the axial focus position of wafer 33), a differential amount of light will be detected by differential diode detectors 29, 31 and a differential control signal will be generated and amplified by a differential power amplifier circuit 73 of control circuit 71. As shown in FIG. 2C, the amplified differential control signal is applied (as a DC level of positive or negative polarity) via a switch 75 to select servo motors 237, 239 or 241, as described hereinafter, or is applied to a Z-axis servo drive motor 175 (shown in FIG. 12) for moving projection lens 13 (actually, for moving a tower structure enclosing projection lens 13 in a vertical direction parallel to an optical axis 14 of the system) relative to wafer 33 to focus the top surface of wafer 33 at the image plane 45 of projection lens 13. The magnitude of the differential signal is proportional to and, hence, indicates the extent to which projection lens 13 is to be moved by servo drive motor 175 in order to be in focus, and the polarity of the signal indicates the direction in which projection lens 13 is to be moved to bring wafer 33 into focus at the image plane 45 of projection lens 13.

Thus, when the intensity of light striking detector 29 from aperture 25 is less than the intensity of light striking detector 31 from aperture 27, differential power amplifier circuit 73 produces a differential signal having a negative polarity (indicating that wafer 33 lies between projection lens 13 and the image plane 45 of the projection lens). This causes projection lens 13 to be moved away from wafer 33 and the top surface of wafer 33 to be brought into focus at the image plane 45 of the projection lens. Conversely, when the intensity of light striking detector 29 from aperture 25 is greater than the intensity of light striking detector 31 from aperture 27, differential power amplifier circuit 73 produces a differential signal having a positive polarity (indicating that wafer 33 lies beyond the image plane 45 of projection lens 13). This causes projection lens 13 to be moved toward wafer 33 to bring the top surface of the wafer into focus at the image plane 45 of the projection lens.

Figure 5:
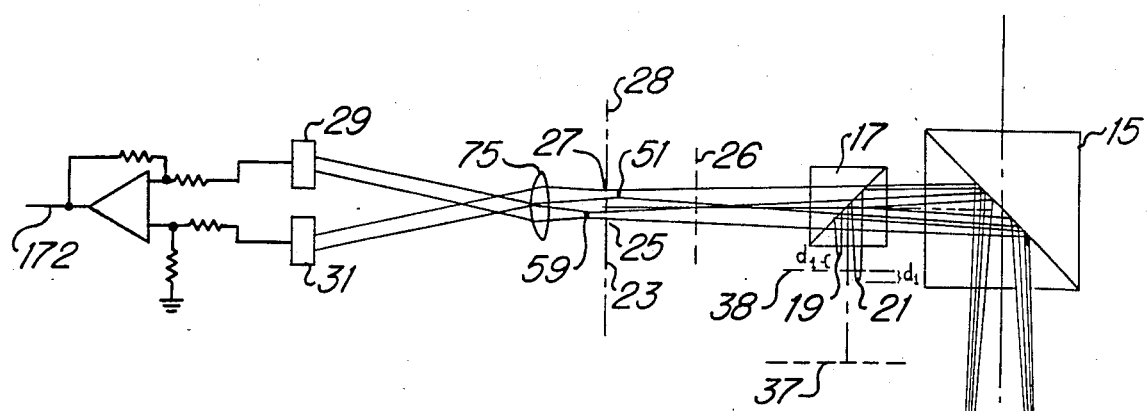
FIG. 5 is a combined block and schematic diagram showing an alternative embodiment of the apparatus of FIG. 2A.

FIG. 5 shows a more sophisticated version of full aperture focus detection apparatus 11. Whereas the apparatus of FIG. 2A utilizes only a small portion of the surface area of semiconductor wafer 33 for reflecting each of the beams of light from focusing light sources 19, 21, the apparatus of FIG. 5 utilizes a much larger area of the wafer surface to reflect light so as to compensate for differences in reflectivity of different areas of the wafer surface. For example, each reflecting area used by the apparatus of FIG. 2A is approximately 30 microns (30μ) in diameter, or approximately 700μ² in area, with the center-to-center distance being, for example, 25μ. Thus, as may be expected, there will be little, if any, overlap of the adjacent reflecting areas when the apparatus of FIG. 2A is utilized. However, because the reflectivity of the wafer surface varies across the microstructure patterns already formed on the wafer, it will be appreciated that the differential signal generated by detectors 29 and 31 may be influenced undesirably by those reflectivity variations.

Figure 6:
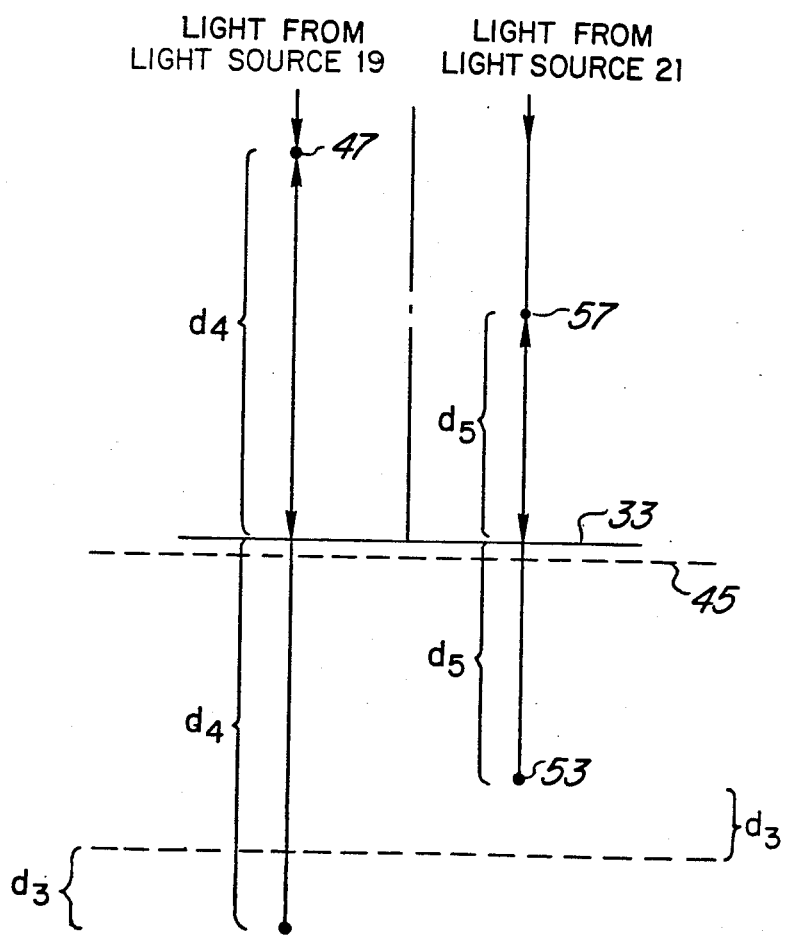
FIG. 6 is a graphic illustration of reflection of light from a wafer, the focus condition of which is detected by the apparatus of FIG. 5.
Figure 7:
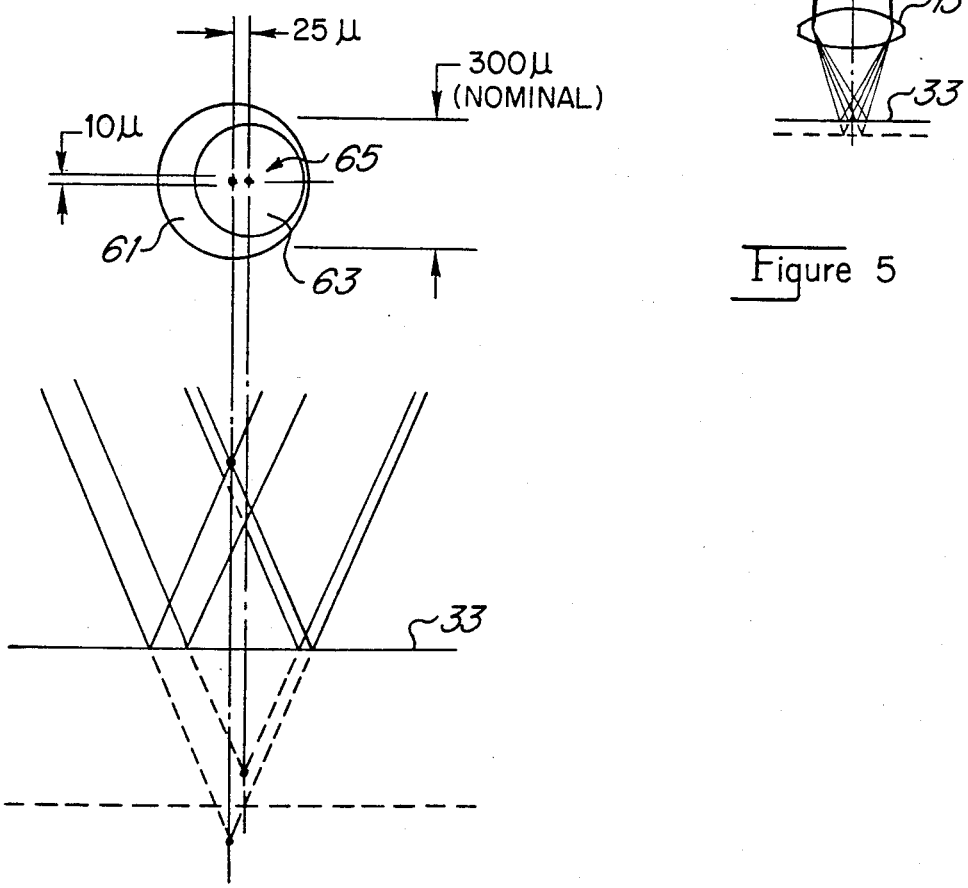
FIG. 7 is a diagrammatic illustration showing areas of a wafer surface as illuminated by the apparatus of FIG. 5.

As may be seen from FIG. 3, the dominant factor relating to the size of each reflecting area on wafer 33 is the distance between imaginary planes 49, 55 and the wafer surface. Therefore, as shown in FIG. 5, by moving light sources 19, 21 away from re-image plane 37 to positions a distance $d_1$ in front of and behind a new imaginary re-image plane 38, real images 47 and 53 are significantly displaced from the surface of wafer 33, as shown by FIGS. 6 and 7. This results in significantly larger areas of the surface of wafer 33 (e.g., regions 61, 63 of about 300μ in diameter or approximately 70,000μ² in area) being utilized for reflecting the beams of light from light sources 19, 21. Because the distance between centers of the reflecting areas utilized by the apparatus of FIGS. 2A and 5 does not change (but remains approximately 25μ as shown in FIG. 7), it may be seen from FIG. 7 that the reflecting areas can be made to overlap significantly (by about 89 percent) when the apparatus of FIG. 5 is utilized. Thus, if one portion of common illuminated area 65 had a reflectivity different from that of another portion of the same area, this would not result in different intensities of reflected light reaching the detectors 29, 31.

Figure 2C:
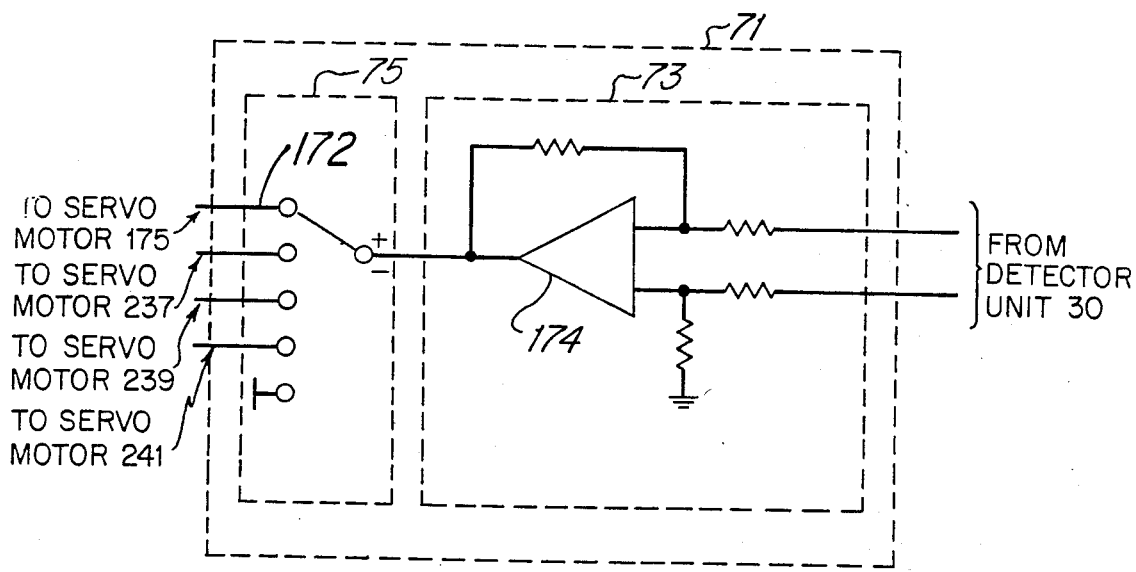

It may be appreciated that in the focus detection apparatus 11 of FIG. 2A, apertures 25, 27 may be symmetrically displaced about re-image plane 26, as shown in FIG. 2E, rather than light sources 19, 21 being symmetrically displaced about re-image plane 37, as shown in FIG. 2A. Alternatively, the apertures 25, 27 and the light sources 19, 21 may be symmetrically disposed about re-image planes 26 and 37, as shown in FIGS. 2E and 2A, respectively, with no difference in the function of the focus detection apparatus 11. When light sources 19, 21 are moved from re-image plane 37 to new re-image plane 38, as shown in FIG. 5, aperture plate 23 must be moved to a new location, namely to a new alternate re-image plane 28 beyond alternate re-image plane 26 so that the operation of detectors 29 and 31 will be the same in FIG. 5 as in FIG. 4.

It may also be appreciated that utilizing more than two pairs of light sources in front of and behind re-image plane 38 (shown in FIG. 5), together with correspondingly more pairs of apertures and diode detectors, will provide further improvement in the above-described net overlap technique (i.e., will provide a greater percentage of overlap of the reflecting areas, which further lessens the likelihood of error in detection due to differences in reflectivity of different areas of the wafer surface). Such an apparatus with additional light sources, apertures and diode detectors, though not illustrated, is also within the scope of this invention.

FIG. 2B shows an alternative arrangement of light sources for the focus detection apparatus 11 of FIG. 2A. In the arrangement of FIG. 2B there is included an aperture plate 50 having precisely sized holes 60, 70 (e.g., holes 100μ in diameter corresponding to the diameter of the fiber optic light sources 19, 21 of FIG. 2A), which are used to fix or establish the size of the beams of light emitted from oversized (relative to holes 60, 70) optical fiber light sources 100, 110, and which are also used in conjunction with a beam splitter 80 and a beam bender 90 to precisely fix or locate the light sources 100, 110 with respect to light path 41. Beam splitter 80 and beam bender 90 permit the locating of light sources 100, 110 proximate to aperture plate 50 for purposes of sizing while retaining them at the distance $d_1$ and $d_2$ from re-image plane 37.

Figure 8:
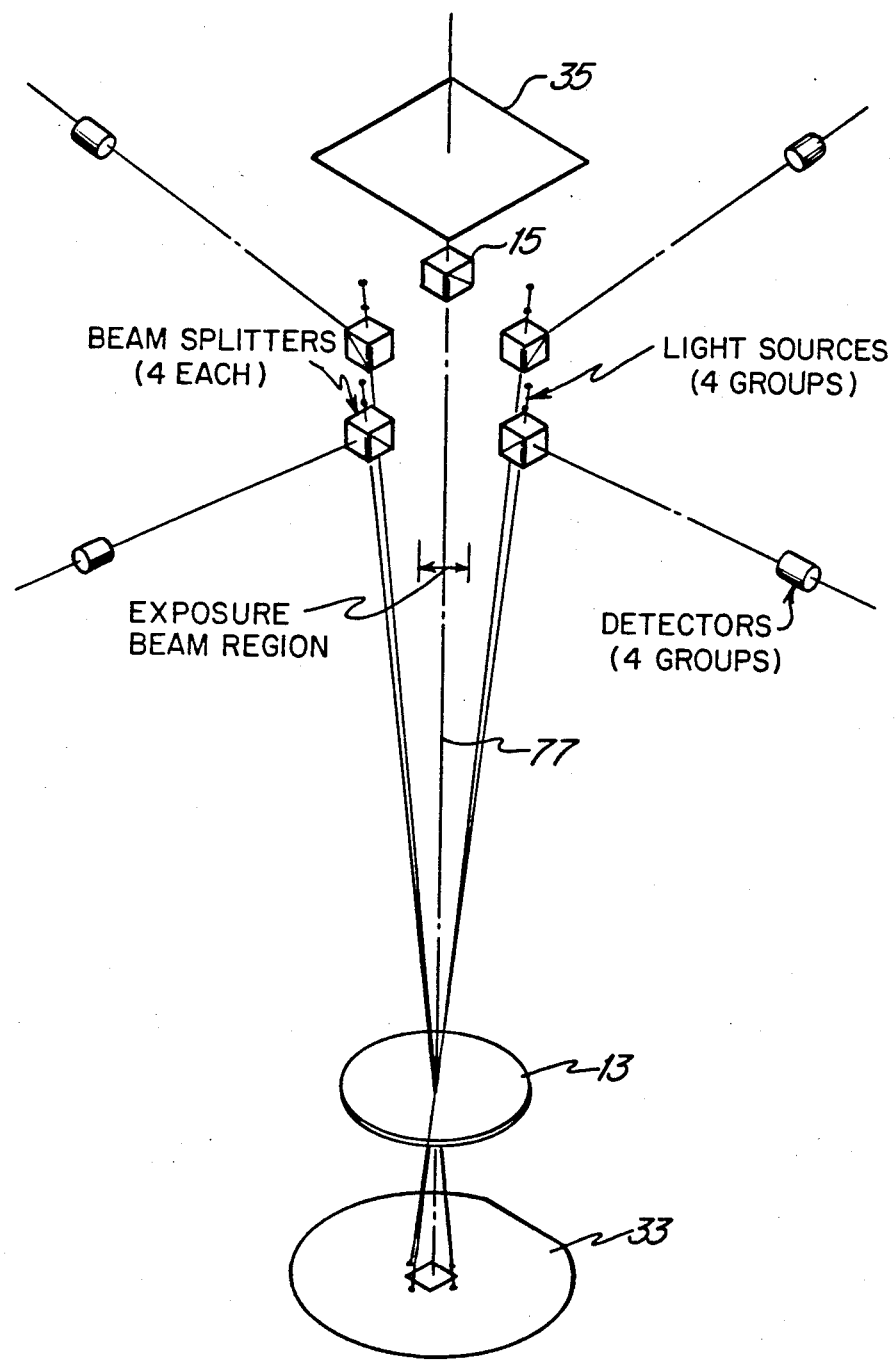
FIG. 8 is a perspective view showing another alternative embodiment of the apparatus of FIG. 2A.

FIG. 8 illustrates an alternative embodiment of the present invention where the light sources and detectors are located below beam splitter 15 (and outside the exposure beam region). This alternative embodiment permits the light path from the light sources to the plane of wafer 33 to be made significantly longer, resulting in much larger reflecting areas (e.g., 700,000μ²). Additionally, this alternative embodiment obviates the need for beam splitter 15 (beam splitter 15 is therefore not included in the focus detection apparatus) and, consequently, eliminates the light loss occasioned by the two 20 percent reflections performed by beam splitter 15. In FIG. 8 four sets of light sources and detectors are utilized, each set being located an equal distance from an optical axis 77 and outside of the active exposure beam region. With the focus detection apparatus of FIG. 8, wafer 33 is determined to be in focus when the output signals from the detectors are averaged to zero by amplifier circuit 73 (FIG. 2D) of control circuit 71. Because the detectors in FIG. 8 are outside of the exposure beam region, the system may remain active and the shutter associated with the imaging light source need not be closed during focusing operations. In addition, differential output signals produced by the various groups of detectors are used to optimally level the exposure plane (the top surface of wafer 33) as described hereinafter.

Figure 9:
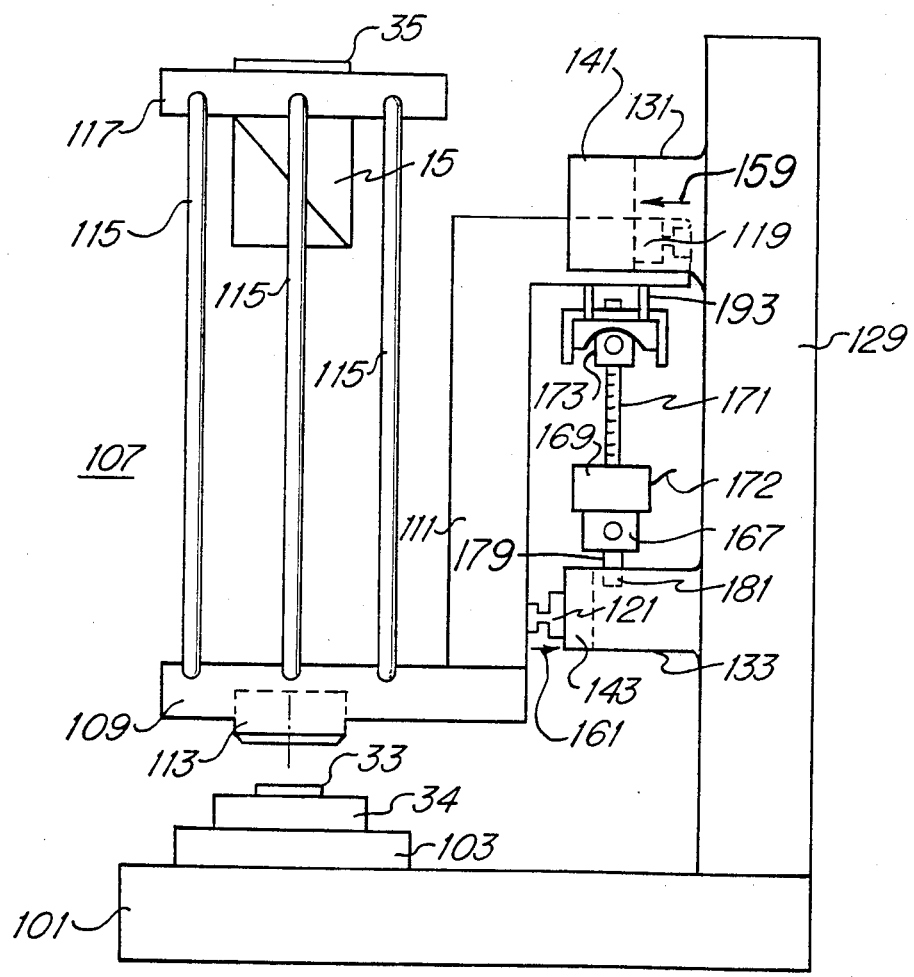
FIG. 9 is a right side view of a kinematic lens positioning apparatus included in the system of FIG. 1.
Figure 11:
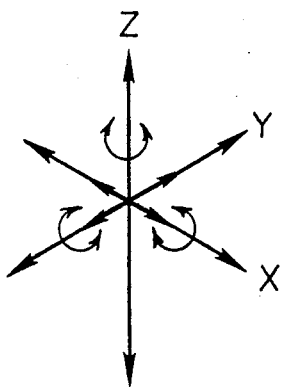
FIG. 11 is a graphic illustration of the directions in which the apparatus of FIG. 9 is constrained from moving.

Referring now to FIG. 9, there is shown a fixed granite block 101, a stage 103 and a chuck 34 supporting wafer 33. Immediately above wafer 33 is supported the kinematic lens positioning apparatus 107 including a tower portion comprising a base 109, a vertical member 111 extending from the base, a projection lens enclosure 113 including the projection lens (not shown), and a set of six substantially vertical bars 115 (three being shown). Each of these bars has one end affixed (e.g., bolted) to the base 109 and the other end similarly affixed to a top member or reticle holder 117, which holder also supports beam splitter 15 and reticle 35. Also included in the tower portion of the kinematic lens positioning apparatus 107 are five air bearings 119, 121, 123, 125 and 127 disposed as shown in FIGS. 9, 10A and 10B for permitting vertical (translational) movement of the tower portion along the Z-axis only. Of the six degrees of freedom shown in FIG. 11, translational movement along the X and Y axes and rotational movement about the X, Y and Z axes are constrained by the air bearings 119, 121, 123, 125 and 127 located as shown in FIGS. 9, 10A and 10B. Air bearings 119, 121 and 125 act to prevent translational movement along the Y axis and rotational movement about the X and Z axes, while air bearings 123 and 127 act to prevent translational movement along the X axis and rotational movement about the Y axis. Thus, only translational (vertical) movement along the Z axis is not constrained.

As shown in FIG. 9, a cast iron casting 129 operates as a support structure for kinematic lens positioning apparatus 107. Casting 129, which, for example, weighs approximately 180 pounds, is rigidly affixed (by means of anchor bolts, not shown) to granite block 101 and extends vertically from the rear of granite block 101 parallel to optical axis 14 (FIG. 2A). Extending horizontally from the front of casting 129 (as best shown in FIGS. 10A and 10B) are five supports 131, 133, 135, 137 and 139 for five precision blocks 141, 143, 145, 147 and 149, which are lapped and adjusted (e.g., by means of an autocollimator) to have flat vertical faces on which the five air bearings may ride (e.g., air bearings 119, 121, 123 and 127 ride respectively on flat vertical faces 151, 153, 155 and 157). The weight of kinematic lens positioning apparatus 107 loads the air bearings with translational forces. As shown in FIGS. 9, 10A and 10B, a translation force is exerted on air bearings 119 in the direction indicated by arrow 159, a translational force is exerted on air bearings 121 and 125 in the direction indicated by arrow 161, a translational force is exerted on air bearings 123 in the direction indicated by arrow 163, and a translational force is exerted on air bearing 127 in the direction indicated by arrow 165.

Figure 12:
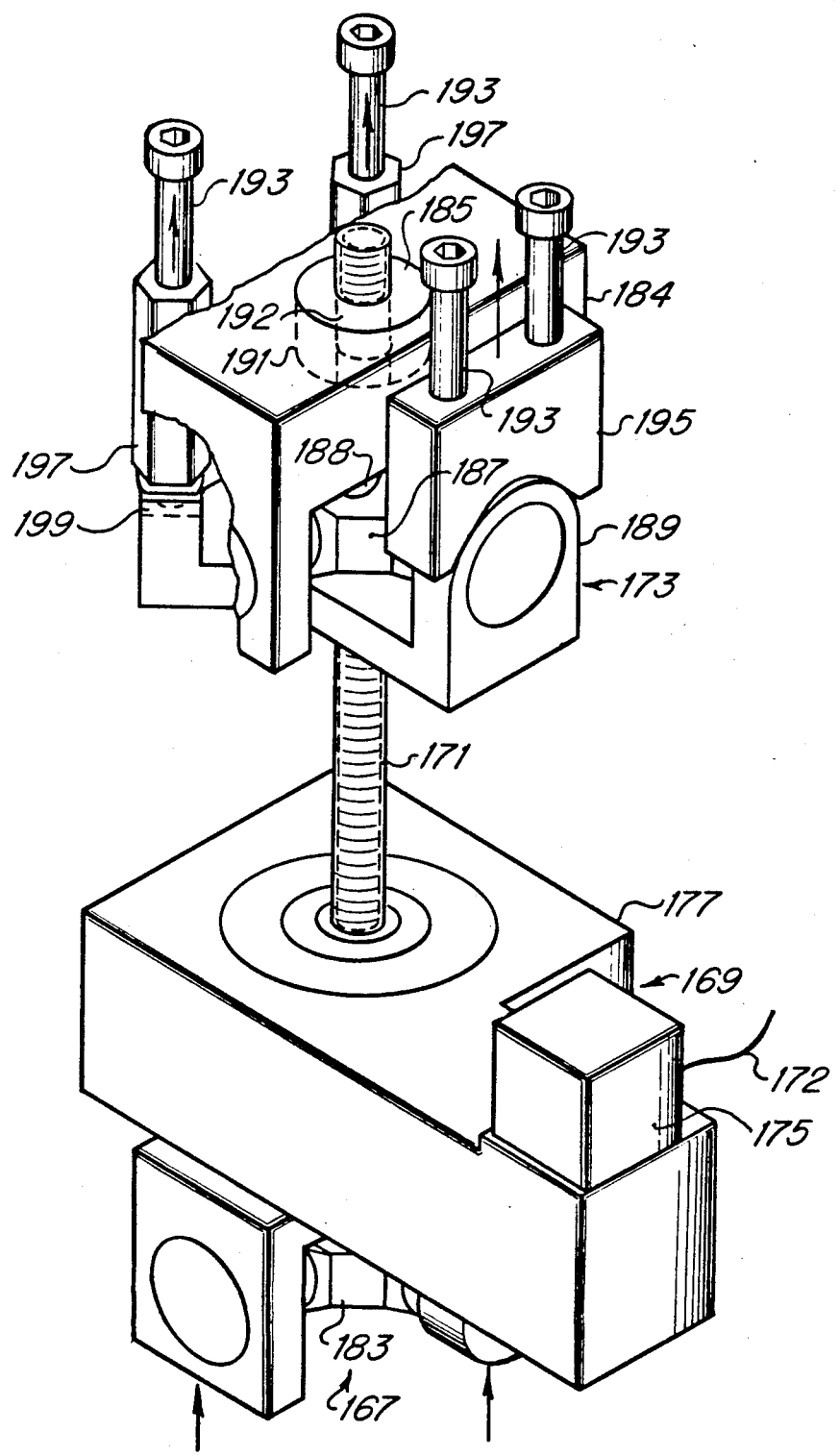
FIG. 12 is an auxiliary view of a drive mechanism of the apparatus of FIG. 9.

As shown in FIGS. 9 and 12, kinematic lens positioning apparatus 107 also includes a drive portion comprising a first or lower universal joint assembly 167, servo motor drive and gear box assembly 169, a ball screw 171, and a second or upper universal joint assembly 173 upon which vertical member 111 of the tower portion of kinematic lens positioning apparatus 107 is supported for vertical movement of the tower portion with respect to casting 129. Motor drive and gear box assembly 169, which includes servo motor 175 and a gear box assembly 177, is mounted upon lower universal joint assembly 167. Actually, motor drive and gear box assembly 169 is mounted upon one leg (not shown) of lower universal joint assembly 167, with the other leg 179 being inserted into a hole 181 (FIG. 9) of the casting 129 and affixed firmly to casting 129 as a support for motor drive and gear box assembly 169 and lower universal joint assembly 167. Within the lower universal joint assembly 167, however, the universal joint itself (i.e., universal joint 183 shown partly in FIG. 12) is freely movable.

Servo motor 175 is coupled, via gear box assembly 177, to ball screw 171 for driving or applying a torque to the ball screw in response to receipt by the servo motor of a drive voltage (e.g., via lead 172) provided by servo amplifier 174 of control circuit 71 (FIG. 2A) in response to a signal generated by focus detection apparatus such as focus detector 11. Ball screw 171 is coupled, via gear box assembly 177, to servo motor 175 and to lower universal joint assembly 167 and is freely swivelable with respect to the center of universal joint 183. Universal joint 183 acts to prevent gear box assembly 177 from rotating whenever a torque is applied by servo motor 175 to ball screw 171 via gear box assembly 177.

As shown in FIG. 12, a second or upper universal joint assembly 173 comprises a ball nut retainer frame 184, a ball nut 185 screwed into retainer 184, a universal joint 187, and a tower lift bar 189. Except for having a hole 188 drilled through the center of universal joint 187 to permit passage of ball screw 171, the upper universal joint is identical to lower universal joint 183. Ball nut retainer 184 has a threaded hole 191 through which ball nut 185 is screwed. Ball nut 185, in turn, has a return ball track (not shown) through which balls circulate and a threaded hole 192 through which ball screw 171 is screwed. Ball nut 185 also has a threaded exterior for mating with threaded hole 191.

Spherical ended pins 197 and a V-block 195 are a part of the tower portion of kinematic lens positioning apparatus 107. As shown in FIGS. 9 and 12, spherical ended pins 197 and V-block 195 are affixed to vertical member 111 by bolts 193 and are supported by tower lift bar 189 for vertical movement therewith. In response to an amplified differential signal applied via lead 172 from amplifier 174 (FIG. 2A), for example, servo motor 175 rotates ball screw 171, thereby driving ball nut 185 and ball nut retainer 184 and causing tower lift bar 189 and the tower portion (including pins 197 and V-block 195) to be moved vertically, the distance moved being in accordance with the magnitude of the differential signal and the direction of movement (up or down) being in accordance with the polarity of the differential signal.

On one side of tower lift bar 189, the tower portion is seated by means of V-block 195, and on two other sides of the tower lift bar (one side not shown), the tower portion is seated by means of pins 197 extending into V-grooves 199. This manner of seating permits easy removal and accurate replacement of the tower portion of kinematic lens positioning apparatus 107 from the drive portion of the apparatus. The height of the ball screw 171 and the length of the block surfaces upon which the air bearings 119, 121, 123, 125 and 127 (FIGS. 9, 10A and 10B) ride may be chosen to be any reasonable value (e.g., 3 inches) sufficient to permit easy removal or service of the stage or chuck without requiring removal of the projection lens.

Unlike prior-art systems, which utilize cables to move a projection lens assembly vertically and flexures to guide the assembly, kinematic lens positioning apparatus 107 utilizes rigid components such as ball screw 171, ball nut 185, double universal joints 183, 187 and five air bearings 119, 121, 123, 125 and 127 to provide freedom of movement in a selected direction (vertical) and yet not overconstrain the apparatus in other directions. As such, kinematic lens positioning apparatus 107 comprises a rugged, substantially non-sensitive apparatus (e.g., non-sensitive to environmental changes such as temperature, vibration, or impact).

Figure 13:
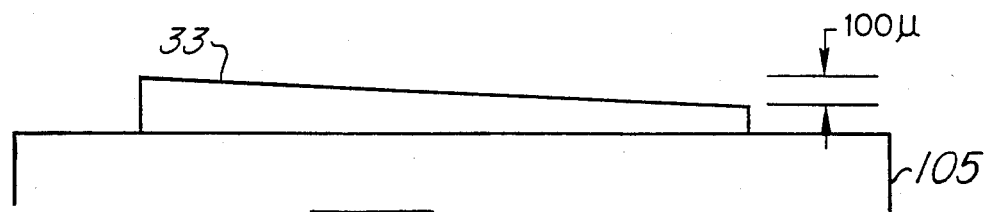
FIG. 13 is a side view of a non-parallel wafer which the system of FIG. 1 is able to detect and compensate for in focusing and chuck leveling.

Referring back to FIG. 1, there is shown the kinematic wafer chuck differential leveling or positioning apparatus 201 included in the optical focusing system of the present invention. This kinematic differential leveling or positioning apparatus 201 comprises a chuck 105, a chuck support plate, a drive means, an eccentric means and a constraining means. When actuated by signals from the aforementioned detectors, the drive means actuates the eccentric means, which operates in conjunction with the chuck support plate and with the constraining means to differentially level or elevate the plane of the chuck 105 so as to position the top surface of the wafer 33 normal to the optical axis of the system. This leveling action compensates for non-flat conditions of the wafer surface (for example, for a trapezoidally shaped wafer 33 which has non-parallel top and bottom surfaces such that the top surface is slanted when the wafer is placed on chuck 105 as shown in FIG. 13).

As indicated hereinabove, the kinematic lens positioning apparatus 107 may be actuated to bring into focus a selected plane (normally the top surface of the wafer 33) or, more specifically, the center of a selected exposure area on the surface of the wafer. However, the wafer 33 may be found to have as much as a 100 microns difference in height from one edge to another (as shown in FIG. 13) and yet still satisfy the specifications of the Semiconductor Equipment and Materials Institute. In such an event, if, for example, ten exposures were to be made across the surface of the wafer 33 from edge to edge, then, for each exposure, there would be approximately a ten micron difference in elevation or height from side to side of the exposure. But, as indicated hereinbefore, where the desired depth of focus of the projection lens 13 is in the range ±1 micron, this would create a gross (approximately five times) out-of-focus condition on either side or edge of the exposure because, although the portion of the wafer surface in the center of the exposure may be brought into focus as described hereinbefore, the portion of the wafer surface on one side of the exposure would be out of focus by being too near projection lens 13 and the portion of the wafer surface on the other side of the exposure would also be out of focus by being too far from projection lens 13. To bring the sides as well as the center of the exposure into focus, kinematic differential leveling or positioning apparatus 201 provides for differentially leveling the chuck 105. This differential leveling action brings the top surface of the wafer 33 into a focus plane that is nominally common to all surface portions of the wafer which lie within the selected exposure area.

Differential leveling is performed without having the chuck 105 translate in the X or Y direction or rotate in the X-Y plane about the Z axis. The chuck 105 is made to have three degrees of freedom of movement (i.e., translation along the Z axis and rotation about the X and Y axes, which rotation may be regarded as equivalent to translation along the Z axis with the Z axis positioned at three points 203, 205, 207 shown in FIG. 14, the points being located in the X-Y plane at a selected radius 60°, 180° and 300°, respectively, from the Y axis). The chuck 105, with the wafer 33 having previously been secured (by vacuum) to its top surface and positioned relative to the optical axis of the system, is moved at points 203, 205 and 207 in a manner equivalent to translation along axes $Z_1$, $Z_2$, $Z_3$.

Figure 15:
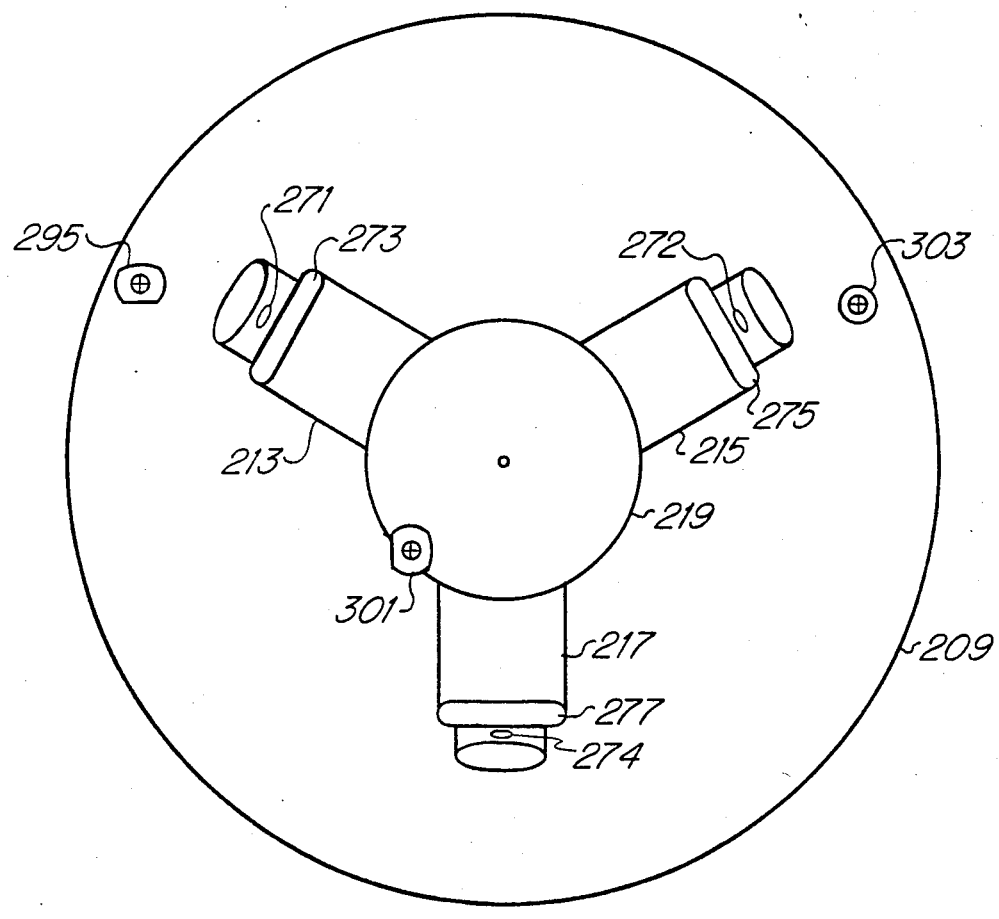
FIG. 15 is a top plan view of a chuck support plate of the kinematic wafer chuck differential leveling or positioning apparatus included in the system of FIG. 1.
Figure 16:
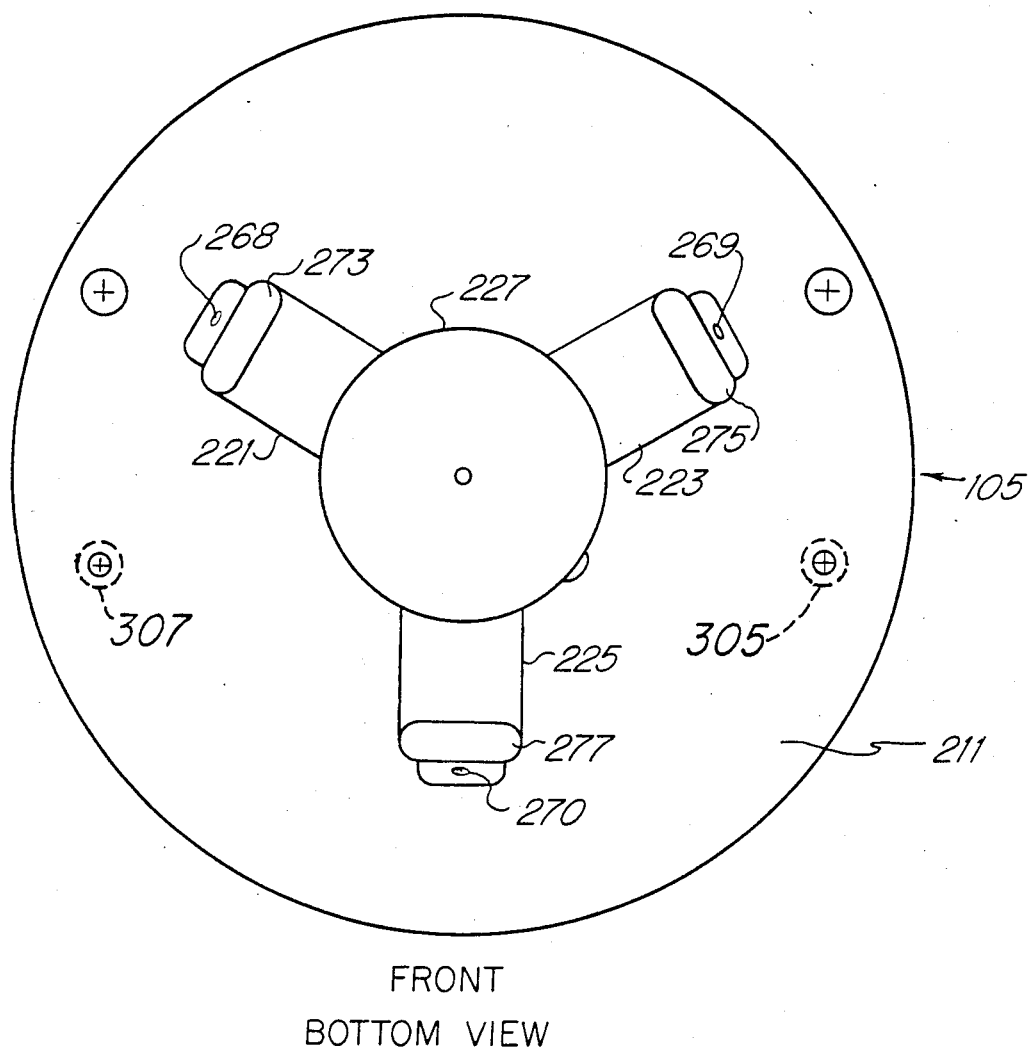
FIG. 16 is a bottom plan view of a chuck of the kinematic wafer chuck differential leveling or positioning apparatus included in the system of FIG. 1.
Figure 17:
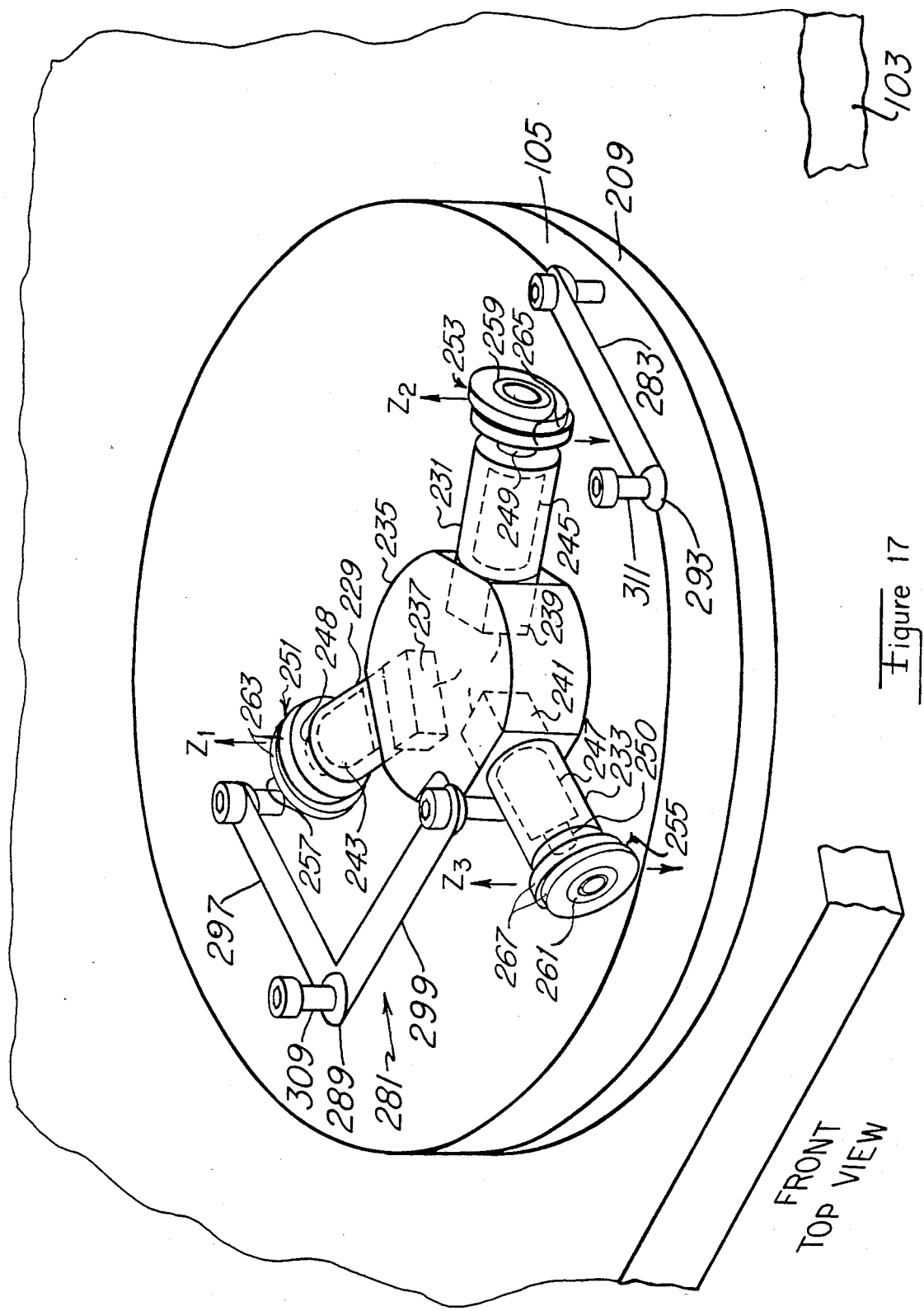
FIG. 17 is a top perspective view showing the chuck support plate and the chuck of FIGS. 15 and 16 with the upper surface of the chuck illustrated as though it were transparent or cut away to reveal other selected elements of the kinematic wafer chuck differential leveling or positioning apparatus include in the system of FIG. 1.

As shown in FIGS. 15 and 16, a chuck support plate 209 is provided beneath chuck 105 (chuck 105 differs from chuck 34 shown in FIG. 2A in that chuck 105 includes kinematic wafer chuck differential leveling or positioning apparatus 201 not present in chuck 34). This support plate 209 mates with a bottom portion 211 of chuck 105 in a manner which permits elongated structures 213, 215, 217 and substantially round structure 219 to mate with corresponding structures 221, 223, 225 and 227 to form enclosures 229, 231, 233 and 235 (FIG. 17) defining cavities therein. Disposed within the enclosures, as shown in FIG. 17, are three small servo motors 237, 239, 241 (e.g., 12 millimeters in diameter) coupled to three small gear assemblies 243, 245, 247 (e.g., 96:1 gear assemblies also 12 millimeters in diameter). The gear assemblies in turn are coupled, via three shafts 248, 249, 250 (e.g., each shaft being 2 millimeters in diameter), to three double (paired) eccentrics 251, 253, 255. Each eccentric of each double eccentric 251, 253, 255 is eccentrically offset, for example, 0.005 inch in a direction opposite to the other eccentric of the same double eccentric so that as the corresponding motor and gear assembly rotates one eccentric of each double eccentric travels in an upward direction and the other travels in a downward direction.

Each double eccentric 251, 253, 255 is provided with a corresponding pair of ball bearing assemblies 257, 259 or 261. A small tire or roller 263, 265, 267 is mounted about each ball bearing assembly 257, 259, 261. As the shafts 248, 249, 250 rotate, the double eccentrics 251, 253, 255 travel up and down with one roller of each double eccentric contacting a bottom portion of chuck 105 at a spot 268, 269 or 270 (FIG. 16) and the other roller of the same double eccentric contacting the top of chuck support plate 209 at a spot 271, 272 or 274 (FIG. 15). Proximate to each contact spot, an end milled cavity 273, 275 or 277 is defined to provide clearance for the oppositely acting roller to bypass that contact spot and to actually travel below the center line corresponding to the axial center of shaft 248, 249 or 250. By being able to contact the chuck 105 at the three spots 268, 269 and 270 (corresponding to points 203, 205 and 207 in FIG. 14) and to travel in upward and downward directions, the double eccentrics 251, 253, 255 provide a differential leveling action (i.e., a leveling action at three different points on the chuck and, hence, at three different points on the surface of a wafer placed thereon).

Figure 2D:
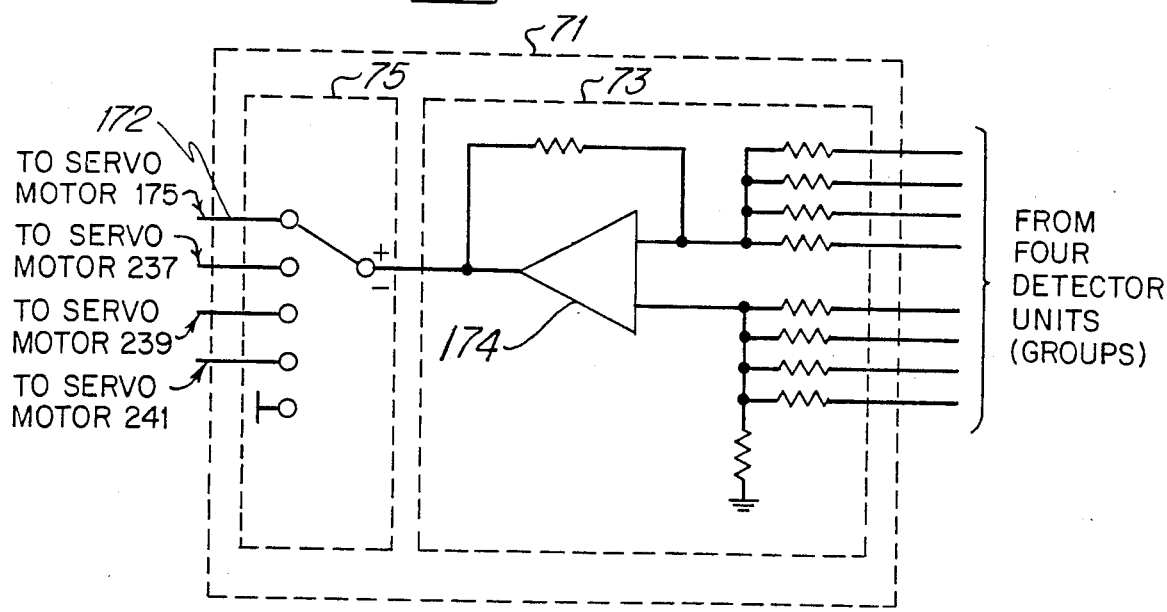
Figure 14:
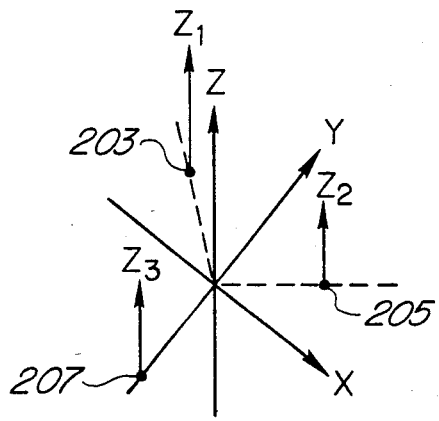
FIG. 14 is a graphic illustration of the action of a kinematic wafer chuck differential leveling or positioning apparatus included in the system of FIG. 1 and employed for compensating for wafer surface irregularity such as that shown in FIG. 13.

In the actual leveling operation or procedure, the focus detection apparatus 11 (FIG. 1) may be used to first bring into focus the center of the wafer 33 (e.g., a 100 millimeter diameter wafer) by positioning the kinematic lens positioning apparatus 107 so that the center of the wafer comes into focus, by then moving the stage 103 successively so that the portion of the wafer surface corresponding to each of the three spots 203, 205 and 207 of FIG. 14 is positioned along the optical axis of the system, and by then, individually, bringing each of the three spots into focus by differentially leveling or elevating the chuck 105. Thus, as shown in FIGS. 2A, 2C, 12 and 17, after the center of the wafer 33 is positioned along optical axis 14, servo motor 175 moves the tower portion of kinematic lens positioning apparatus 107 and focuses the center of the wafer in response to an amplified differential signal received from detector unit 30 via amplifier circuit 73, switch 75, and lead 172. Thereafter, the wafer 33 is positioned so that one of the three points 203, 205 or 207 (for example, point 203) is positioned along the optical axis 14, and the servo motor 237 is then actuated to move chuck 105 up or down at that point 203 by means of double eccentric 251, thereby leveling the chuck at that point so as to bring the wafer surface at that point into focus in response to an amplified differential signal from detector unit 30 (via power amplifier circuit 73 and switch 75 of control circuit 71 shown in FIG. 2C). In a similar fashion, after being positioned along the optical axis 14, points 205 and 207 are leveled by double eccentrics 253 and 255, respectively, in response to actuation of servo motors 239 and 241, respectively, by amplified differential signals received, via control circuit 71, from detector unit 30. Where four detector units (groups) are employed, as shown in FIG. 8, the differential signals from the detector units may be averaged and amplified by amplifier circuit 73, as shown in FIG. 2D.

Figure 18:
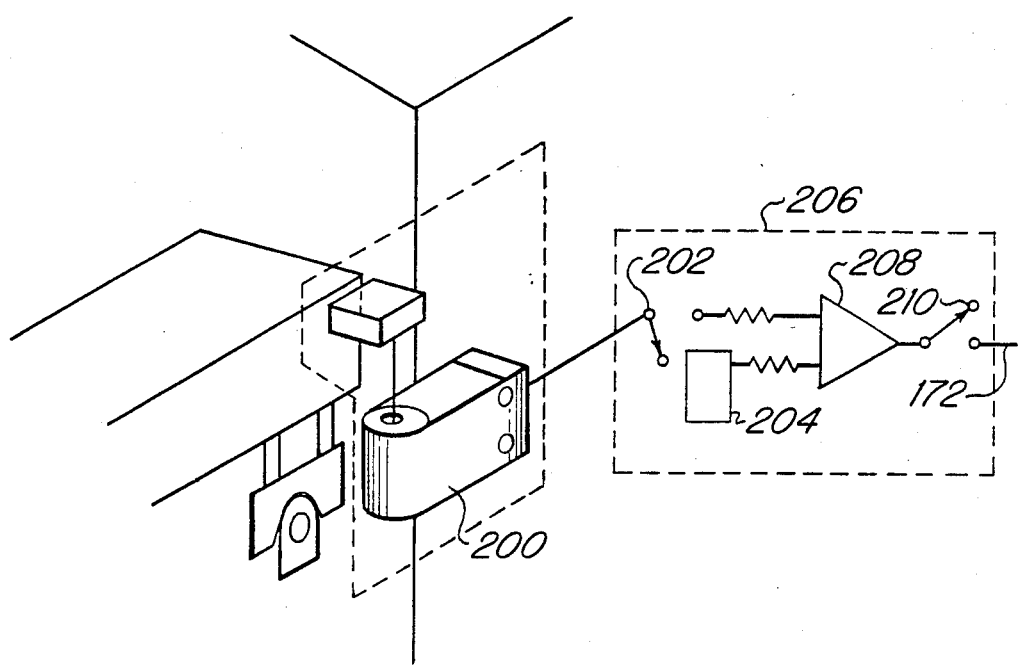
FIG. 18 is a combined perspective view and schematic diagram of a distance measuring transducer or repositioning device utilized with the apparatus of FIG. 9.

To maintain the Z axis position of kinematic lens positioning apparatus 107 constant during periods of time that switch 75 is not connected to lead 172 (i.e., when the optical focusing system is not controlling the focusing operation), a distance measuring transducer 200 may be utilized in conjunction with a control circuit 206, as shown in FIG. 18. An ouput signal from transducer 200 is applied, via a switch 202, to a sample-and-hold circuit 204 each time kinematic lens positioning apparatus 107 is positioned in response to amplified differential signals received, via control circuit 71, from detector unit 30. After kinematic lens positioning apparatus 107 is positioned, and switch 75 is disconnected from lead 172, switch 202 is switched, thereby connecting the output of distance measuring transducer 200 directly to an amplifier 208. Meanwhile, sample-and-hold circuit 204 holds the last voltage output received from transducer 200 before the switching of switch 202. Amplifier 208 acts as a comparator and amplifier and applies a drive voltage through a switch 210 (now closed) to lead 172, thereby maintaining kinematic lens positioning apparatus 107 in its position and maintaining the voltage from transducer 200 constant in closed loop fashion. Such a distance measuring transducer is commercially available as, for example, a Linear Variable Differential Transformer, Catalog Part No. 050H-DC from Schaevitz Engineering Corporation in Cambden, N.J.

Figure 20:
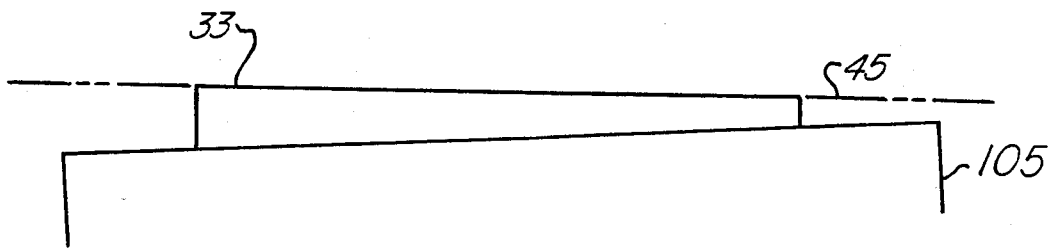
FIG. 20 is a side view of a leveled but non-flat wafer which the system of FIG. 1 is able to detect and compensate for in focusing.

As indicated hereinbefore, three points (203, 205, 207 in FIG. 14) on a wafer surface may be made to coincide with image plane 45 of projection lens 13. However, as shown in FIG. 20, the top surface of wafer 33 may in fact not be flat, but may be undulated or irregular. Therefore, as the wafer 33 is progressively positioned in different image positions under projection lens 13, the wafer surface will, in general, deviate from image plane 45 and will be out of focus. Thus, when a step-and-repeat exposure mode of operation is employed, kinematic lens positioning apparatus 107 will again respond to inputs (amplified differential signals) from the focus detection apparatus 11, and the tower and projection lens structure will track or follow the actual contour of the surface of wafer 33. Because the weight of the chuck 105 acts downward upon the paired or double rollers 263, 265, 267 and the paired or double rollers are displaced sideways from one another a selected eccentric distance, a resulting torque loads the kinematic differential leveling apparatus 201 causing it to be substantially backlash free (i.e., free from dead time or dead backlash space) when leveling directions are reversed.

In the foregoing, the manner in which the kinematic differential leveling apparatus 201 levels a wafer has been described, where the apparatus has only three degrees of freedom of movement. The manner in which the apparatus 201 constrains the remaining three degrees of freedom of movement is described below.

Figure 19:
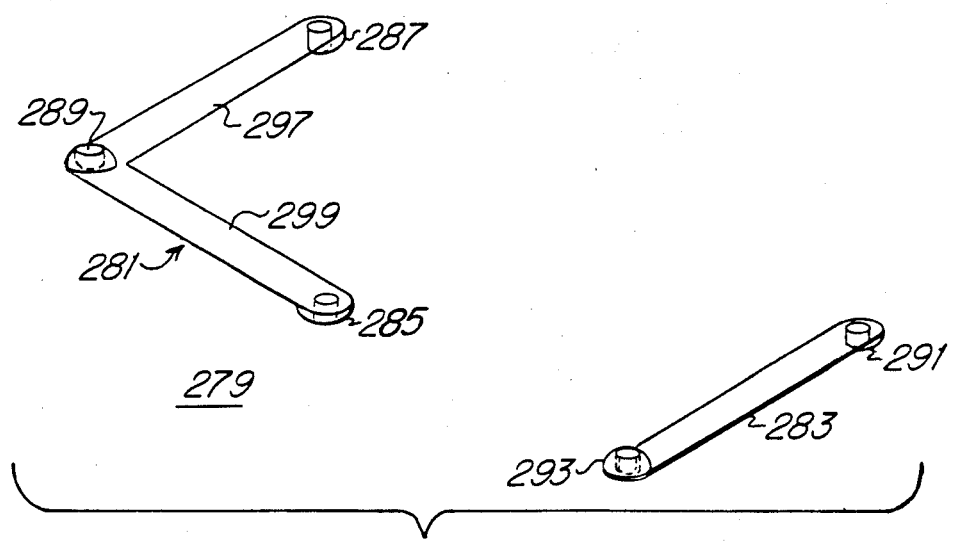
FIG. 19 is a perspective view showing constraining elements of the apparatus of FIG. 17 in greater detail.

Referring now to FIG. 19, there is shown a constraining mechanism 279 comprising an L-shaped link member 281 (e.g., a beryllium-copper leaf spring of approximately sixteen mils in thickness having two legs, each leg being approximately 1¾ inches in length) and an elongated link member 283. L-shaped link member 281 has three hemispherical balls 285, 287, 289 hard soldered to its top and bottom surfaces, the two hemispherical balls 285 and 287 being hard soldered to the bottom surface at the end portions of the L-shaped link member and the remaining hemispherical ball 289 being hard soldered to the top surface at the apex of the L-shaped link member. Also, two hemispherical balls 291, 293 are hard soldered to elongated link member 283, one hemispherical ball 291 being soldered at one end of the elongated link member to its bottom surface and the other hemispherical ball 293 being soldered at the other end of the elongated link member to its top surface.

As shown in FIGS. 15, 16, 17 and 19, hemispherical ball 287 has a hole therethrough for receiving a screw, which is screwed into an elongated counter sink (tapped threaded hole) 295 formed in chuck support plate 209 to secure hemispherical ball 287 in place. Counter sink 295 is elongated in a direction orthogonal to leg 297 of L-shaped link member 281. Similarly, hemispherical ball 285 is secured to a threaded elongated counter sink 301 of chuck support plate 209 (the counter sink 301 being elongated in a direction orthogonal to the direction in which counter sink 295 is elongated) such that a leg 299 of L-shaped link member 281 is orthogonal to the direction in which counter sink 301 is elongated. Hemispherical ball 291 of elongated link member 283 is secured to a threaded counter sunk hole 303 of chuck support plate 209. Thereafter, the bottom portion 211 of chuck 105 is secured to chuck support plate 209 by screws 309 and 311 inserted via holes 305 and 307 in the bottom portion 211 of the chuck and screwed into mating threaded holes in hemispherical balls 289 and 293. This firmly secures the bottom portion 211 of chuck 105 to link members 281 and 283. When secured in this manner, the L-shaped and elongated link members 281 and 283 act to constrain chuck 105 from translational movement along the X or Y axis and from rotational movement in the X-Y plane about the Z axis.

I claim:

1. An optical focusing system for positioning an image plane of an imaging lens at a reflective surface of a workpiece, said system comprising:
   source means for directing first and second beams of light through the imaging lens and towards the reflective surface of the workpiece to form first and second input images of portions of the source means at selected distances from the image plane of the imaging lens so that light reflected from the reflective surface of the workpiece is reimaged by the imaging lens to form first and second output images of the first and second input images, respectively, at positions determined by the relative spacing between the reflective surface of the workpiece and the image plane of the imaging lens;
   detector means, responsive to the positions of the first and second output images, for producing a control signal having a magnitude and a polarity indicative of the position of the reflective surface of the workpiece relative to the image plane of the imaging lens; and
   positioning means, repsonsive to the control signal from the detector means, for positioning the image plane of the imaging lens at the reflective surface of the workpiece.

2. An optical focusing system as in claim 1 wherein said source means includes:
   first and second light sources, optically disposed at different distances from the imaging lens, for providing the first and second beams of light; and
   optical means for directing the first and second beams of light from the first and second light sources through the imaging lens to form the first and second input images of the first and second light sources, respectively, at different selected distances from the image plane of the imaging lens.

3. An optical focusing system as in claim 2 wherein said first light source is disposed optically closer to the imaging lens than the second light source so that in the absence of the workpiece the first input image is positioned optically further from the imaging lens than the second input image.

4. An optical focusing system as in claim 3 wherein said imaging lens is disposed for reimaging the light reflected from the reflective surface of the workpiece so that the first output image is positioned optically further from the imaging lens than the second output image.

5. An optical focusing system as in claim 4 wherein said detector means includes:

first and second apertures disposed on opposite sides of and aligned with the first and second output images, respectively; and first and second photodetectors disposed for receiving light passing through the first and second apertures, respectively;

whereby movement of the reflective surface of the workpiece in one sense relative to the imaging lens causes the first and second output images to move in the opposite sense relative to the imaging lens thereby differentially varying the amount of light passing through the first and second apertures and detected by the first and second photodetectors, respectively.

6. An optical focusing system as in claim 2 wherein:

said imaging lens is disposed for imaging an object positioned at an object plane of the imaging lens into the image plane of the imaging lens; and said first and second light sources are disposed on opposite sides of a plane conjugate to the object plane of the imaging lens with the first light source being positioned optically closer to the imaging lens than the second light source so that in the absence of the workpiece the first and second input images are disposed on opposite sides of the image plane with the first input image being positioned optically further from the imaging lens than the second input image.

7. An optical focusing system as in claim 6 wherein:

said first and second light sources are disposed so that the first and second input images are produced as real and virtual images, respectively, on opposite sides of the image plane of the imaging lens at positions determined by the position of the reflective surface of the workpiece relative to the image plane and with the real image being positioned optically closer to the imaging lens than the virtual image; and said imaging lens is disposed for reimaging the light reflected from the reflective surface of the workpiece to produce the first and second output images of the real and virtual images, respectively, on opposite sides of a plane conjugate to the object plane of the imaging lens with the first output image being positioned optically further from the imaging lens than the second output image.

8. An optical focusing system as in claim 7 wherein said detector means includes:

first and second apertures disposed at the last-mentioned conjugate plane and aligned with the first and second output images, respectively; and first and second photodetectors disposed for receiving light passing through the first and second apertures, respectively;

whereby movement of the reflective surface of the workpiece in one sense relative to the imaging lens causes the first and second output images to move in the opposite sense relative to the imaging lens thereby differentially varying the amount of light passing through the first and second apertures and detected by the first and second photodetectors, respectively.

9. An optical focusing system as in claim 1 wherein said detector means includes first and second photodetector means, optically disposed at different distances from the imaging lens, for detecting light from the first and second output images, respectively.

10. An optical focusing system as in claim 9 wherein said first and second photodetector means include:

first and second apertures optically disposed at different distances from the imaging lens; and first and second photodetectors disposed for receiving light passing through the first and second apertures, respectively.

11. An optical focusing system as in claim 10 wherein said first and second apertures are disposed on opposite sides of and aligned with the first and second output images, respectively.

12. An optical focusing system as in claim 11 wherein:

said imaging lens is disposed for imaging an object positioned at an object plane of the imaging lens into the image plane of the imaging lens; and said first and second apertures are disposed on opposite sides of a plane conjugate to the object plane of the imaging lens.

13. An optical focusing system as in claim 1 wherein:

said imaging lens is disposed for imaging an object positioned at an object plane of the imaging lens;

said system has an exposure beam region extending along an optical axis of the system from the object plane through the imaging lens to the image plane;

said source means includes at least first and second light sources, disposed outside the exposure beam region at selected distances from the optical axis, for directing the first and second beams of light through the imaging lens to form the first and second input images; and said detector means includes at least first and second photodetector means, disposed outside the exposure beam region, for detecting light from the first and second output images, respectively.

14. An optical proximity detection system for detecting the proximity of a reflective surface of a workpiece to an image plane of an imaging lens, said system comprsing:

source means for directing first and second beams of light through the imaging lens and towards the reflective surface of the workpiece to form first and second input images of portions of the source means at selected distances from the image plane of the imaging lens so that light reflected from the reflective surface of the workpiece is reimaged by the imaging lens to form first and second output images of the first and second input images, respectively, at positions determined by the relative spacing between the reflective surface of the workpiece and the image plane of the imaging lens; and detector means, responsive to the positions of the first and second output images, for producing a signal having a magnitude and a polarity indicative of the position of the reflective surface of the workpiece relative to the image plane of the imaging lens.

15. An optical leveling system for positioning a reflective surface of a workpiece in an image plane of an imaging lens, said system comprising:

source means for directing light through the imaging lens and towards three spaced regions of the reflective surface of the workpiece to form at each of said regions first and second input images of portions of the source means at selected distances from the image plane of the imaging lens so that light reflected from each region is reimaged by the imaging lens to form corresponding first and second output images at positions determined by the relative spacing between that region and the image plane of the imaging lens;

detector means, responsive to the positions of the first and second output images from each of said regions of the reflective surface of the workpiece, for producing a corresponding control signal having a magnitude and a polarity indicative of the position of that region relative to the image plane of the imaging lens; and leveling means, responsive to the control signals from the detector means for said regions, for positioning the reflective surface of the workpiece in and parallel to the image plane of the imaging lens.

16. An optical plane detection system for detecting the orientation of a reflective surface of a workpiece relative to an image plane of an imaging lens, said system comprising:

source means for directing light through the imaging lens and towards three spaced regions of the reflective surface of the workpiece to form at each of said regions first and second input images of portions of the source means at selected distances from the image plane of the imaging lens so that light reflected from each region is reimaged by the imaging lens to form corresponding first and second output images at positions determined by the relative spacing between that region and the image plane of the imaging lens; and detector means, responsive to the positions of the first and second output images from each of said regions of the reflective surface of the workpiece, for producing a corresponding signal having a magnitude and a polarity indicative of the position of that region relative to the image plane of the imaging lens, the signals for all three of said regions being indicative of the orientation of the reflective surface of the workpiece relative to the image plane of the imaging lens.

* * * * *